(12) United States Patent
Berkens

(10) Patent No.: US 9,760,671 B2
(45) Date of Patent: Sep. 12, 2017

(54) RULE CHECKING

(71) Applicant: NP Komplete Technologies B.V., Eindhoven (NL)

(72) Inventor: Martinus Maria Berkens, Eindhoven (NL)

(73) Assignee: NP Komplete Technologies B.V., Eindhoven (NL)

( * ) Notice: Subject to any disclaimer, the term of this patent is extended or adjusted under 35 U.S.C. 154(b) by 195 days.

(21) Appl. No.: 14/439,075

(22) PCT Filed: Oct. 30, 2013

(86) PCT No.: PCT/NL2013/050772
§ 371 (c)(1),
(2) Date: Apr. 28, 2015

(87) PCT Pub. No.: WO2014/070005
PCT Pub. Date: May 8, 2014

(65) Prior Publication Data
US 2015/0302134 A1    Oct. 22, 2015

(30) Foreign Application Priority Data
Oct. 31, 2012  (EP) .................................... 12190867

(51) Int. Cl.
*G06F 9/455*  (2006.01)
*G06F 17/50*  (2006.01)

(52) U.S. Cl.
CPC ................................ *G06F 17/5081* (2013.01)

(58) Field of Classification Search
USPC .............................. 716/52, 53, 54, 112, 111
See application file for complete search history.

(56) References Cited

U.S. PATENT DOCUMENTS

| 6,275,971 | B1 |   | 8/2001 | Levy et al. |
| 6,948,141 | B1 | * | 9/2005 | Satya ............. G01B 31/318364 716/136 |
| 7,418,693 | B1 | * | 8/2008 | Gennari .............. G06F 17/5068 716/55 |
| 8,041,103 | B2 |   | 10/2011 | Kulkarni et al. |

(Continued)

FOREIGN PATENT DOCUMENTS

TW    2008-25824    6/2008

OTHER PUBLICATIONS

International Search Report, PCT/NL2013/050772; dated Feb. 10, 2014; 2 pages.
Mar. 1, 2017, Taiwanese Official Action; JMP99322TW00; 6 pages.

*Primary Examiner* — Brian Ngo
(74) *Attorney, Agent, or Firm* — Swanson & Bratschun, L.L.C.

(57) ABSTRACT

There is provided a computer-implemented method for verification of a layout of an integrated circuit according to a design intent with a selected manufacturing process. The method comprises defining corner points of a first circuit part 1 as seed points 3, projecting a specifically designed polygon shape 4 proximal to a seed point 3 and calculating an overlap area 5 between the projected polygon shape 4 and a second circuit part 2. The layout is rejected when the overlap area does not conform to a threshold overlap area determined by the design intent.

17 Claims, 14 Drawing Sheets

(56) References Cited

U.S. PATENT DOCUMENTS

| | | | |
|---|---|---|---|
| 2002/0144219 A1* | 10/2002 | Zachariah | G06F 17/5081 716/52 |
| 2005/0091632 A1* | 4/2005 | Pierrat | G03F 1/68 716/53 |
| 2005/0172247 A1* | 8/2005 | Papadopoulou | G06F 17/5081 716/112 |
| 2009/0265673 A1 | 10/2009 | Avanessian et al. | |
| 2012/0042290 A1* | 2/2012 | Berkens | G03F 7/70125 716/55 |
| 2013/0059238 A1* | 3/2013 | Kurjanowicz | G11C 17/16 430/5 |

* cited by examiner

RULE CHECKING

RELATED APPLICATIONS

This application is a 35 U.S.C. §371 national phase application of PCT/NL2013/050772 (WO 2014/070005), filed on Oct. 30, 2013, entitled "Design Rule Checking", which application claims the benefit of European Application No. EP 12190867.7, filed Oct. 31, 2012, which is incorporated herein by reference in its entirety.

FIELD AND BACKGROUND

The present disclosure relates to a computer-implemented method for verification of a layout of an integrated circuit according to a design intent with a selected manufacturing process. The disclosure further relates to a method for providing verified layout data. The disclosure further relates to a method of manufacturing a mask. The disclosure further relates to a method of manufacturing an integrated circuit. The disclosure further relates to a computer system for verification of a layout of an integrated circuit. The disclosure further relates to a non-transitory computer storage medium.

Designs of integrated circuits are typically obtained using computer aided design (CAD) software. The CAD software may process and store layout data that represents the integrated circuit. The layout data may comprise circuit parts defined e.g. by their edge coordinates. When a design is finished, it can be transferred to one or more masks for manufacturing the integrated circuit or layers thereof.

In order to verify that an integrated circuit design is compliant with manufacturing conditions, i.e. to predict whether a functioning integrated circuit can be reproducibly manufactured from a designed layout, the CAD software may use a process known as "design rule checking" (DRC). In this process, the compliance of a designed layout or parts thereof may be quantified e.g. as one or more parameters that indicate whether a layout is acceptable or not and/or indicate a degree of compliance.

The task of verification of an integrated circuit may be divided into sub tasks wherein critical regions of the integrated circuit are verified. A critical region may be defined as a region comprising critical points or hotspots wherein a local topology of the circuit parts provides an essential functionality of the circuit. These terms are known e.g. from U.S. Pat. No. 8,041,103. In one example a functioning of the circuit may depend on an overlap between two circuit parts to establish an electrical interconnection there between. In another example, a functioning of the circuit may depend on there being sufficient spacing between two circuit parts to prevent short-circuit or other type of interference between the circuit parts.

Determining whether a layout is compliant may depend on limitations of the manufacturing process for producing the integrated circuit. For example, the manufactured layout may be influenced by the accuracy of alignment between different layers, e.g. the manufactured circuit parts may be relatively shifted compared to the original design. To take this limitation into account when the design intent is to form an electrical connection, U.S. Pat. No. 6,275,971 describes a method for checking integrated circuit layout design files. Unfortunately the method may not be suitable for all via geometries. Furthermore, there are also other limitations of the manufacturing process besides alignment that need to be considered.

Most notably, the manufacturing process may be limited by a minimal spot size or critical dimension that can be reproducibly manufactured. This limitation may cause e.g. a rounding of corners and edges of the circuit parts compared to the original polygon patterns. Also, circuit parts may be smaller, larger or otherwise deformed compared to the original design.

In current state of the art, design rules for determining compliance are typically described as limitations on distances between shapes, and/or or parts of shapes such as corners or edges. In order to check limitations that hold in two dimensions (e.g. on a silicon substrate surface), combinations of distance checks can be used. For instance a check can be made if a distance between a first edge of a first circuit part and a second edge of a second circuit part has a large enough value in either the horizontal or the vertical direction.

Unfortunately, the current design rule checking can become increasingly complicated when physical manufacturing conditions are taken into account. For example, when a design contains two overlapping square circuit parts, the corresponding set of design rules may need to consider that the shapes, e.g. corners, of said parts may be substantially rounded in the corresponding manufactured circuit. This may lead to a cumulative set of conditions wherein combined distances with respect to the rounded shape are checked.

There is a need for a simpler method of design rule checking taking into account physical manufacturing conditions and widely applicable to various design intents and circuit shapes.

SUMMARY

In a first aspect there is provided a computer-implemented method for verification of a layout of an integrated circuit according to a design intent with a selected manufacturing process, the method comprising receiving layout data comprising circuit parts in one or more layers representing the integrated circuit; defining corner points of a first circuit part as seed points; for each seed point projecting a polygon shape proximal to the seed point wherein the polygon shape is selected from one or more reference shapes that are distinct from the circuit parts, wherein a selected reference shape is associated with a local topology of the seed point; calculating an overlap area between the projected polygon shape and a second circuit part in the critical region; and rejecting the layout when the overlap area does not conform to a threshold overlap area determined by the design intent.

The present method verifies the relative positioning between a first and second circuit part by calculating an area of the second circuit part that falls within a region of interest around the edge of the first circuit part. The said region of interest is formed by a polygon shape projected proximal to a point on the corner of the first circuit part, referred to as a seed point. Since the present method measures area instead of distance, the method more closely matches physical effects that happen during lithography. In effect, the present method measures if sufficient light energy will be present at the contact edge/corner when carrying out exposure of the circuit pattern. If sufficient light energy is present near the edge/corner, there will also be resulting deposition (e.g. metal), regardless of its dimensions in either direction. By not having the polygon shape limited to the same shape as the circuit parts, the verification method can be widely applicable to almost any circuit shape and design intent. Using a polygon shape that is distinct from the circuit parts, i.e. having its own independent shape, allows the use of a specifically designed shape for targeted sampling of a specific area of a circuit part such as a corner. As an example, the polygon shape can be designed to check for short circuits around the area of a specific corner. It is presently recognized that in particular the corners of the circuit parts are prone to changes as a result of the said physical effects, e.g. corner rounding, and therefore it will be advantageous to verify these corners with the presently disclosed area-based design rules. The present method thus provides a verification of integrated circuit layouts taking into account physical effects of the manufacturing process. The present method is simpler than traditional design rule checking because the plurality of distance checks, traditionally used, can be replaced with a simple area calculation.

BRIEF DESCRIPTION OF THE DRAWINGS

These and other features, aspects, and advantages of the apparatus, systems and methods of the present invention will become better understood from the following description, appended claims, and accompanying drawing wherein:

DETAILED DESCRIPTION

Figure 1A:
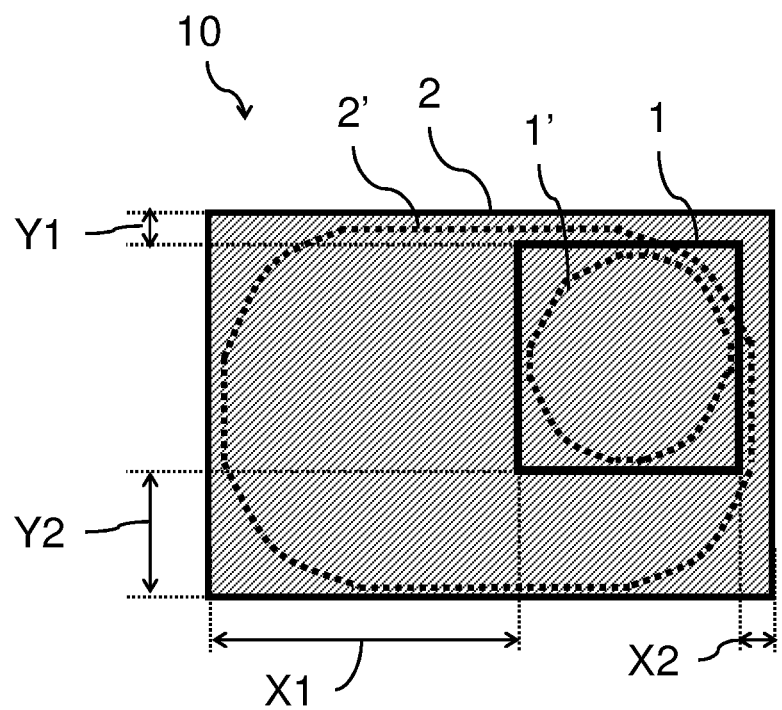
FIGS. 1A and 1B illustrate distance-based methods of design rule checking.

Unless otherwise defined, all terms (including technical and scientific terms) used herein have the same meaning as commonly understood by one of ordinary skill in the art to which this invention belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some instances, detailed descriptions of well-known devices and methods may be omitted so as not to obscure the description of the present systems and methods. Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be further understood that the terms "comprises" and/or "comprising" specify the presence of stated features but do not preclude the presence or addition of one or more other features. All publications, patent applications, patents, and other references mentioned herein are incorporated by reference in their entirety. In case of conflict, the present specification, including definitions, will control.

The present disclosure relates to a method for verification of a layout of an integrated circuit with a selected manufacturing process. Such methods are known in the art as "Design Rule Checking" (DRC). In particular, DRC is known in the field of electronic design automation as a method that determines whether an integrated circuit design satisfies a series of parameters called Design Rules. These parameters may enable the designer to verify the compliance of a design with manufacturing conditions. Design rules are thus typically specific to a particular manufacturing process, e.g. a resolution or other criterion. A design rule set typically specifies certain geometric and connectivity restrictions to ensure sufficient margins to account for variability in the manufacturing process and ensure a reliable product. The most basic design rules include specification of a minimum width of individual shapes such as wires or a minimum distance or overlap between adjacent circuit parts. Due to the complexity and sheer number of circuit parts in a typical integrated circuit, the DRC process is typically performed using CAD software or more specifically DRC software. An example of DRC software is Calibre® by Mentor Graphics®.

When a layout is not compliant with the Design Rules, the layout may be rejected. The verification process may comprise multiple checks. Therefore, even if a layout is accepted by a first check, it may still be rejected by a second check. After a problem in the layout is identified that triggers a rejection, the verification process may continue to check for further problems. The checking may also be halted when a certain number of problems are detected and/or if a cumulative set of partial problems reaches a threshold. When a layout is rejected on one or more grounds, this may trigger a redesign of the layout. A redesign process may be performed manually, automatically or a combination of these, e.g. an assisted semi-automatic redesign process. The redesign process may continue until the layout is fully accepted, i.e. passes all Design Rules. When a layout is finally accepted, it may be used in the selected manufacturing process wherein the designed circuit parts are transferred onto a product, e.g. wafer.

The term "circuit part" is used herein to refer to a part of the layout data. The layout data including the circuit parts represents a layout of an integrated circuit. The integrated circuit may be comprised in a multi-layer stack of different circuit layers. The layout data may comprise circuit parts in data layers matching the physical structures in layers of the integrated circuit. Alternatively or in addition, the layout data may comprise circuit parts in derived data layers e.g. resulting from Boolean combinations and/or other derivations such as OPC of the physical layers and structures. A circuit part may be represented in the layout data e.g. by a "polygon shape", i.e. a shape comprised of connected line segments forming a surface within their circumference. According to the present definition, a circle may also be considered a polygon shape. However, from a computational point of view of e.g. the design rule checking process, it may be preferred that the circuit parts be represented by polygon shapes comprising straight line segments, e.g. rectangles, triangles, or combinations thereof. The same argument applies for the projected polygon shape used in the present method for calculating an overlap region. In particular it may be computationally more advantageous to calculate an area comprising straight lines only instead of an area comprising curved lines. The layout data may define circuit parts by the edges and/or filling of shapes representing a transferred layout of the circuit having a designated electrical and/or optical function. The layout may be transferred e.g. using a mask and/or deposition. The deposition material may comprise e.g. metal, semi-conductors, or insulators. Different circuit parts may comprise different materials.

The term "design intent" is used herein to refer to the intended functional relationship between circuit parts, whether it is intended in the design to form an electrical connection or an electrical isolation. Also other design intents are possible, e.g. a specific range of separation or overlap. The term electrical connection includes electrically conducting connections between circuit parts. Electrically conducting connections may comprise e.g. metal or semi-conducting materials. The design intent may be explicitly defined by a designer, automatically inferred by the CAD program, or combinations thereof. In some cases, an essential functionality of the circuit may depend on the establishing of an electrical connection between circuit parts. In other cases, an electrical connection should be avoided to prevent unintended short-circuits. In the latter case it is desired that the circuit parts be electrically isolated from each other. The term "isolated" refers to a minimum degree of separation between the circuit parts. A separation may be provided by increasing a spacing between circuit parts and/or by insertion of insulating (i.e. non-conducting) material between the circuit parts.

To provide an intended electrical connection between parts, a certain degree of overlap or connection between the circuit parts may be desired. In particular, it is recognized that a too narrow connection may lead to undesired increases in ohmic resistance.

To provide an intended electrical isolation, it may be desired to avoid certain proximity between the circuit parts. It is noted that an intended electrical isolation may be more strict than a demand that the circuit parts do not touch. In particular, circuit parts that are not touching but are close together may still cause a short-circuit and/or interference. It is noted that an intended isolation between circuit parts may be implicit in that any non-intended electrical connection may be considered an intended electrical isolation. There may also be exceptions where, although an electrical connection was not intended, it is not harmful for the functioning of the circuit that an electrical connection is established anyway.

The term "critical region" will be used to refer to regions of the layout of the integrated circuit that may trigger a check for compliance. The need to check whether two parts are compliant with their intended design typically depends on their relative proximity. Typically when a proximity or degree of overlap between parts is closer to a resolution of the selected manufacturing process, the need to check compliance may increase. In one example, a critical region is identified as a region comprising first and second circuit part wherein a distance between an edge of the first circuit part and an edge of the second circuit part is within a threshold distance. The threshold distance can be predetermined according to the manufacturing process, e.g. a distance at which the relative proximity of circuit parts can be critically influenced by the resolution of the manufacturing process possibly resulting in loss of functionality of the circuit parts. Typically the critical threshold distance is on the order of the critical dimension of the manufacturing process, e.g. a distance lower than two or three times the critical dimension. Also other criteria for designating critical regions may be applied. In another example, a critical region is manually selected. In yet another example, the entire layout is divided into critical regions wherein a proximity and overlap of all neighbouring circuit parts is checked for compliance.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The description of the exemplary embodiments is intended to be read in connection with the accompanying drawings, which are to be considered part of the entire written description. In the drawings, the size and relative sizes of systems, components, layers, and regions may be exaggerated for clarity. Embodiments are described with reference to schematic illustrations of possibly idealized embodiments and intermediate structures of the invention.

In the description, relative terms as well as derivatives thereof should be construed to refer to the orientation as then described or as shown in the drawing under discussion. These relative terms are for convenience of description and do not require that the system be constructed or operated in a particular orientation unless stated otherwise. It will be understood that when a particular step of a method is referred to as subsequent to another step, it can directly follow said other step or one or more intermediate steps may be carried out before carrying out the particular step. Like numbers refer to like elements throughout.

Figure 1B:
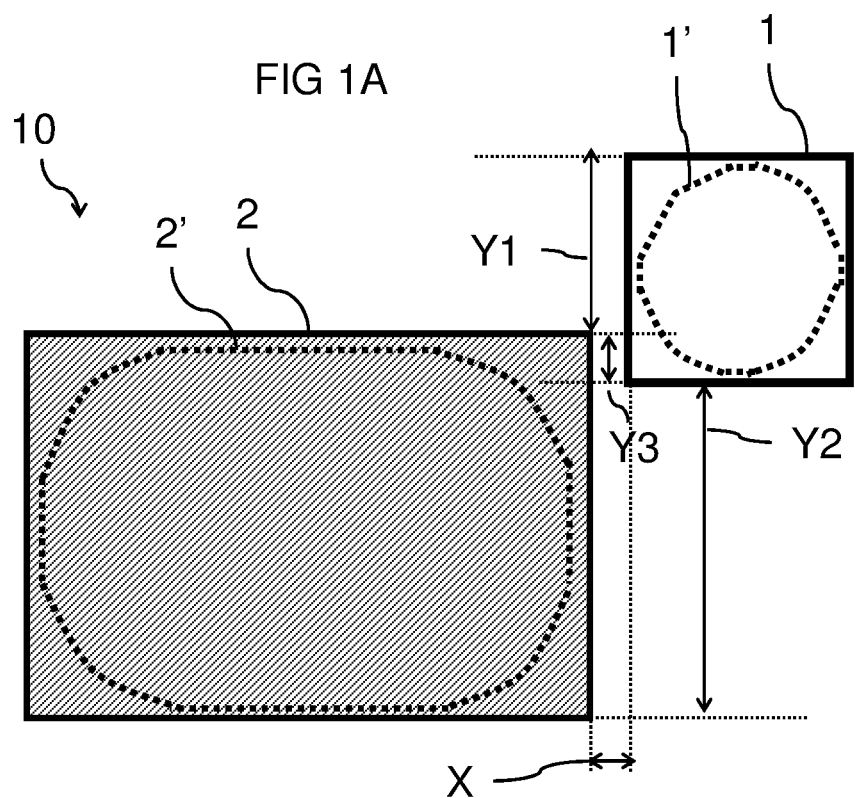

FIGS. 1A and 1B illustrates distance-based methods of design rule checking.

FIG. 1A illustrates a critical region 10 wherein a first circuit part 1 is designed to form an electrical connection with a second circuit part 2. The circuit parts 1 and 2 may be designed as comprised in different layers of a multi-layer device stack. The layers may be adjacent to each other. The dotted lines indicate a possible shape of the circuit parts 1' and 2' after a manufacturing process. It can be seen that the manufacturing process may lead to a reshaping of the designed parts. In particular, a typical manufacturing process, limited by a certain resolution, may cause a deformation of the original design, in this case a rounding of the corners and a shrinkage of the overall area.

To ensure a proper connection between the circuit parts, a typical design rule may comprise distance checks between the edges of the circuit parts. One possible rule may be that distances X1, X2, Y1 and Y2 must have some minimal value, otherwise the layout can not be accepted for manufacturing. In a simple approach, all minimal values for X1, X2, Y1 and Y2 are the same number (e.g. zero). However, as it was noted that the manufacturing process may deform the original shapes of the circuit parts, the design rules should preferably take into account the expected deformation (indicated by reference numerals 1' and 2'), e.g. corner rounding effects. This may be done by adjusting the values of the minimum distances.

One approach to ensure contact within the circular shapes of the final product may be a design rule wherein either both X1 and X2 are large and for Y1 and Y2, a small value is accepted, or Y1 and Y2 are large and X1 and X2 are smaller.

So the second circuit part 2 either a large horizontal extent beyond the edge of the first circuit part 1, or large vertical extend beyond. More combinations of accepted values are possible too. In general, Design Rules in the current state of the art are typically formulated in terms of measured distances and wherein multiple distance checks may be combined by Boolean operations.

For example, a set of design rules could be that the pattern of FIG. 1A is acceptable if:

(X1>=0 nm & X2>=0 nm & Y1>=50 nm & Y2>=50 nm)|
(X1>=30 nm & X2>=30 nm & Y1>=40 nm & Y2>=40 nm)|
(X1>=40 nm & X2>=40 nm & Y1>=30 nm & Y2>=30 nm)|
(X1>=50 nm & X2>=50 nm & Y1>=0 nm & Y2>=0 nm)
where "&" means a logical AND of the condition and "|" means the logical OR of the condition.

FIG. 1B illustrates a critical region 10 wherein a first circuit part 1 and a second circuit part 2 are designed to be electrically isolated from each other. Similar as discussed for FIG. 1A, a set of design rules may written that take into account the deformations of the respective shapes in the fabricated circuit parts 1' and 2'. The design rules may e.g. comprise a set of dependent distance checks using the distances X, Y1, Y2, and Y3.

It will be appreciated that the current state of the art distance checks such as illustrated in FIGS. 1A and 1B can be complicated to design and implement, especially, when dealing with more complex shapes than simple squares. It was found that the complication of setting up design rules may be considerably alleviated by the presently disclosed methods that will be discussed in the following.

Figure 2A:
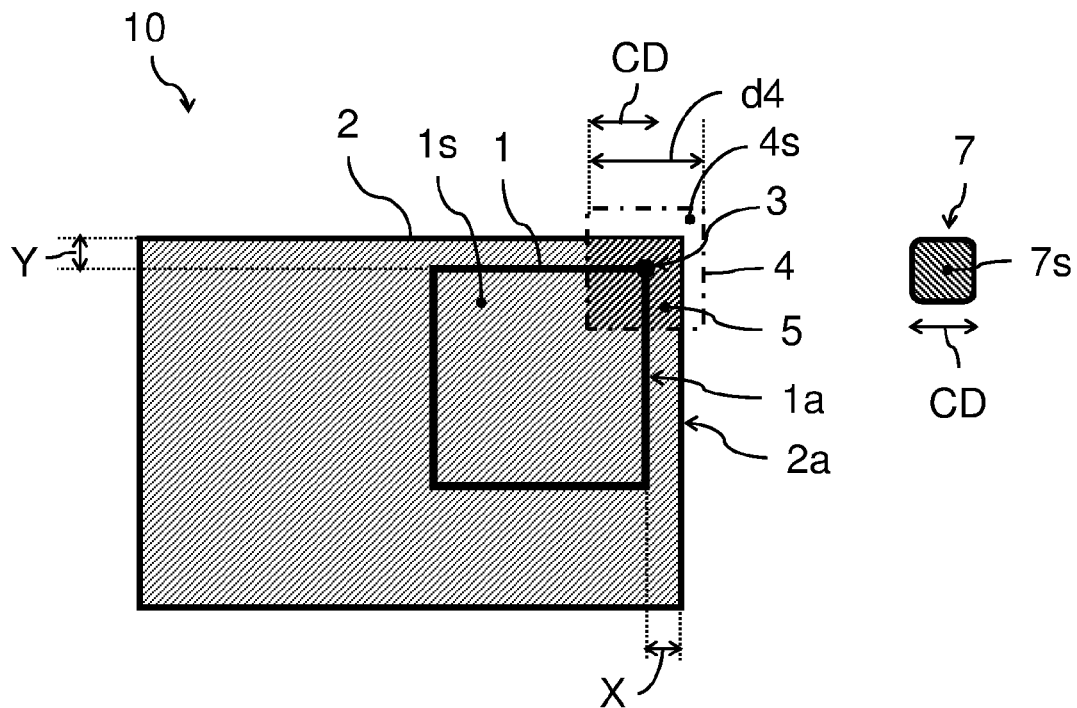
FIGS. 2A and 2B illustrate area-based methods for design rule checking.
Figure 2B:
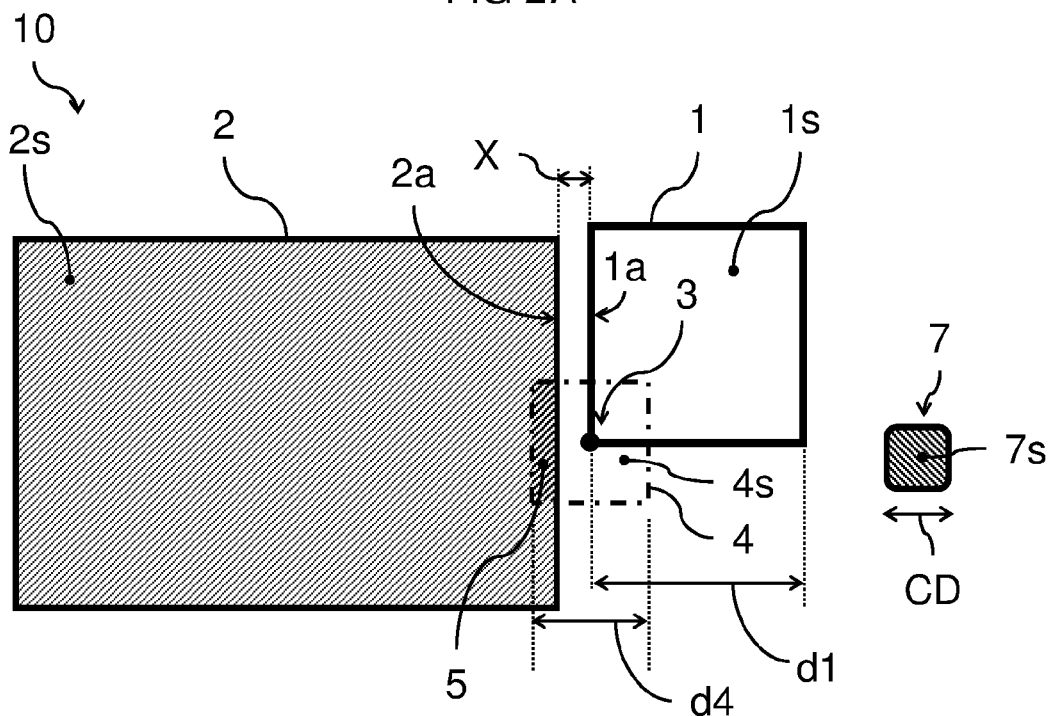

FIGS. 2A and 2B illustrate steps of a verification method involving area-based design rule checking. FIG. 2A illustrates a verification method of layout data, more particularly a critical region 10, wherein a design intent is an electrical connection between circuit parts 1 and 2 that are represented here by rectangles. On the other hand, FIG. 2B illustrates a verification method wherein a design intent is an electrical isolation between the circuit parts 1 and 2. Also other design intents are possible, e.g. a design intent of a transistor wherein an overlap between circuit parts in different layers of the layout is desired to be within a certain area threshold range.

Both figures illustrate a respective critical region 10 of the layout data comprising the first and second circuit parts 1 and 2. A point 3 in the critical region 10 is selected on an edge 1a of the first circuit part 1, preferably at a corner of the first circuit part. This point will be referred to as the seed point 3. A polygon shape 4 is projected in the critical region 10 proximal to the seed point 3. The projected polygon shape 4 and the second circuit part 2 in the critical region 10 form an overlap area 5. The overlap area 5 is used in the verification of the critical region 10.

It will be understood that the first and second circuit parts may be comprised in different data layers representing physical layers of a stacked circuit. Different data layers and the circuit parts comprised therein may share a common coordinate system. The common coordinate system may correspond e.g. to the common X and Y position of the physical structures in layers of the stacked circuit. On the other hand, e.g. a Z coordinate or layer number N may be used to distinguish between different physical or derived layers of the stacked circuit. It will be understood that relative placement and/or overlap between circuit parts 1 and 2 in different layers can be determined by projecting these shapes onto the common (X, Y) coordinate system.

Analogously, also the polygon shape 4 can be projected onto the common coordinate system to determine the overlap region 5.

In an embodiment, the polygon shape 4 is designed to have a surface area 4s lower than a surface area is of the first circuit part 1 and higher than a surface area 7s of a minimum spot size 7 of the selected manufacturing process. The polygon shape having a surface area lower than a surface area of the first circuit part may have an effect of to locally sampling the presence of the second circuit part near the edge or corner of the first circuit part, e.g. as opposed to a large area density check. At the same time, the polygon shape having a surface area higher than a minimum spot size of the manufacturing process may have as an effect that the area of the polygon shape is large enough to sample deviations caused by limitations of the manufacturing process. Alternative or in addition to the polygon shape having a surface area higher than the minimum spotsize, a dimension d4 of the polygon shape is preferably higher than the critical dimension CD and/or preferably lower than a size or dimension d1 of the first circuit part 1. Preferably, the polygon shape 4 also has a surface area 4s lower than a surface area 2s of the second circuit part 2 and/or a dimension d4 lower than a size or dimension of the second circuit part 2 to locally sample the presence of the second circuit part.

With reference to FIG. 2A, the verification may comprise accepting the layout of the critical region if the design intent is an electrical connection between the first and second circuit parts 1,2 and the overlap area 5 is higher than a predefined threshold connection area. In an embodiment, the verification may further comprise rejecting the layout if the design intent is an electrical connection and the overlap area 5 is lower than a threshold connection area. Alternatively, the layout is not rejected on the basis of a single check, but may require additional check that may be cumulative. For example, a layout may be accepted when, even though a first overlap area is below a threshold, a cumulative area of a plurality of overlap areas is above a cumulative threshold. Physically this may correspond to a situation wherein one of the edges of the first circuit part is not within a boundary of the second circuit part but the other edges are still well enough within the boundary to successfully make the connection.

With reference to FIG. 2B, the verification may comprise rejecting the layout of the critical region if the design intent is an electrical isolation between the first and second circuit parts 1,2 and the overlap area 5 is higher than a predefined threshold isolation area.

It is noted that the polygon shape 4 is not part of the design itself, but only used as a tool for calculating the overlap area 5. In other words, the polygon shape 4 is distinct from the first and second circuit parts 1,2. By having a polygon shape that is distinct from the first and second circuit parts, the verification method is not limited to the shapes of the circuit parts. As a consequence, the method can be more versatile, e.g. more universally applicable for design checking of various circuit part shapes and design intents. In the present embodiments, the polygon shape 4 is a rectangle. Alternatively also other polygon shapes may be used. In the present embodiments a perimeter of the projected polygon shape 4 surrounds the seed point 3. This may have an advantage that the polygon shape samples the area around the seed point, i.e. a point on the edge of the first circuit part 1. In the presently shown embodiments, the polygon shape 4 is centered on the seed point 3. This may have an advantage that the polygon shape samples all directions around the seed point in a similar fashion. A further advantage when using a rotation symmetric polygon shape such as a rectangle and centering this shape on the seed point may be that more predictable verification result may be obtained for different orientations of the edges of the circuit parts. Alternatively, also non-symmetric polygon shapes can be used, for instance when the manufacturing process has different tolerances in X and Y directions In general, it is preferred that the polygon shape 4 is projected proximal (i.e. in proximity) to the seed point 3, e.g. on a scale relative to a size of the circuit parts or a distance between them. E.g. the term "proximal" may refer to a condition that a centre of mass of the polygon shape 4 is projected within a distance of the corresponding seed point 3 which distance is smaller than a smallest distance X between an edge 1a of the first circuit part 1 and an edge 2a of the second circuit part 2. Alternatively or in addition, the term "proximal" may refer to a condition that a centre of mass of the polygon shape 4 is projected within a distance of the corresponding seed point 3 which distance is smaller than a dimension d1 of the first circuit part 1.

Area thresholds for acceptance or rejection may depend on an area and position of the projected polygon shape 4 relative to the edge 1a. The thresholds may be defined as a percentage of the area 4s of the polygon shape 4 or they may comprise an absolute number, e.g. 100 square nano meters. In some embodiments, the threshold connection area may be 100% of the polygon shape 4 area, e.g. a design with circuit parts intended to be electrically connected may be accepted when the projected polygon shape 4 is completely filled by the second circuit part 2. In other embodiments, another percentage may be used, e.g. 50% or 75% of the polygon shape. When using a polygon shape centered on the seed point, using a 50% threshold may ensure that the edges of the two shapes approximately overlap. Using a threshold of 75% may ensure that the first shape is well within the boundaries of the second shape. In some embodiments, the threshold isolation area may be zero, e.g. a design with circuit parts intended to be electrically isolated may be rejected when any part of the second circuit part 2 falls within an area of the projected polygon shape 4. Also for this design intent, the threshold may be higher, if the polygon shape area extends further from the edge of the first circuit part.

In the shown embodiments of FIG. 2A and FIG. 2B, the edges of the projected polygon shape 4 extend both within and outside the surface area is of the first polygon shape 1. In general it may be preferred that edges of the projected polygon shape 4 extend on both sides of the edge 1a of the first circuit part 1 to sample a region of interest around the said edge 1a. For a designed electrical isolation such as shown in FIG. 2A, preferably, an edge of the projected polygon shape 4 extends within the area of first circuit part 1. In this way the projected polygon shape 4 may sample a region within the first circuit part 1 to measure a degree of overlap between the first circuit part 1 and the second circuit part 2. For a designed electrical isolation such as shown in FIG. 2B, preferably, an edge of the projected polygon shape extends outside the area of first circuit part 1. In this way the projected polygon shape 4 may sample a region beyond the edge 1a of the first circuit part 1 to measure if the second circuit part 2 is sufficiently distanced from the first circuit part 1.

The minimum spot size 7 is shown here for comparison and is not part of the actual layout design. The minimum spot size 7 may be related to a critical dimension CD of the manufacturing process such as known in the art. For example, the minimum spot size may have an area equal to a square of the critical dimension CD of the manufacturing process. The feature that the area 4s of the polygon shape 4 is larger than the area 7s of the minimum spot size 7 may correspond to a feature that the polygon shape 4 samples an area large enough to encompass variations of the manufacturing process on the order of its minimum resolution. The verification may be dependent on a selected manufacturing process by the minimum size of the polygon shape 4 and/or by the thresholds that are chosen for accepting or rejecting the design.

In one embodiment, the layout data represents a multi-layer circuit stack, wherein the first circuit part 1 is in an adjacent layer of the multi-layer circuit stack to the second circuit part 2. In another embodiment, the layout data represents a single layer of a circuit stack, wherein the first circuit part 1 is in the same layer as the second circuit part 2.

A selection which circuit part is designated the "first circuit part 1" and which is designated the "second circuit part 2" is preferably deterministic, i.e. reproducible. In one embodiment, the first circuit part 1 is the circuit part having the smallest area of the first and second circuit parts in the critical region 10. In another embodiment, the first circuit part 1 is the circuit part having a specified relative position with respect to the other circuit parts, e.g. the right-most circuit part. The first and second circuit parts may also be designated based on a function of the circuit parts or layer comprising the circuit part. In one embodiment, a circuit part is designated as first circuit part 1 when it is comprised in a contact layer. It may also be possible to cycle over a selected number of circuit parts one by one wherein each circuit part is designated a first circuit part 1 while all surrounding circuit parts are designated as second circuit part 2 and the verification process performed. The same circuit part may thus be verified both as a first circuit part 1 and a second circuit part 2. The cycle may also include all circuit parts.

In one aspect the present disclosure provides a computer-implemented method for verification of a layout of an integrated circuit according to a design intent with a selected manufacturing process, wherein the design intent is an intended functional relationship between circuit parts, the method comprising receiving layout data comprising the circuit parts in one or more layers representing the integrated circuit; projecting the circuit parts onto a common coordinate system; defining corner points of a first circuit part as seed points; for each seed point selecting a polygon shape from one or more reference shapes that are distinct from the circuit parts, wherein a selected reference shape is associated with a local topology of edges of the circuit parts around the seed point; projecting the polygon shape in the common coordinate system proximal to the seed point on a scale relative to a size of the circuit parts or a distance between the circuit parts calculating an overlap area between the projected polygon shape and a second circuit part in the critical region; and rejecting the layout when the overlap area does not conform to a threshold overlap area determined by the design intent.

Figure 3:
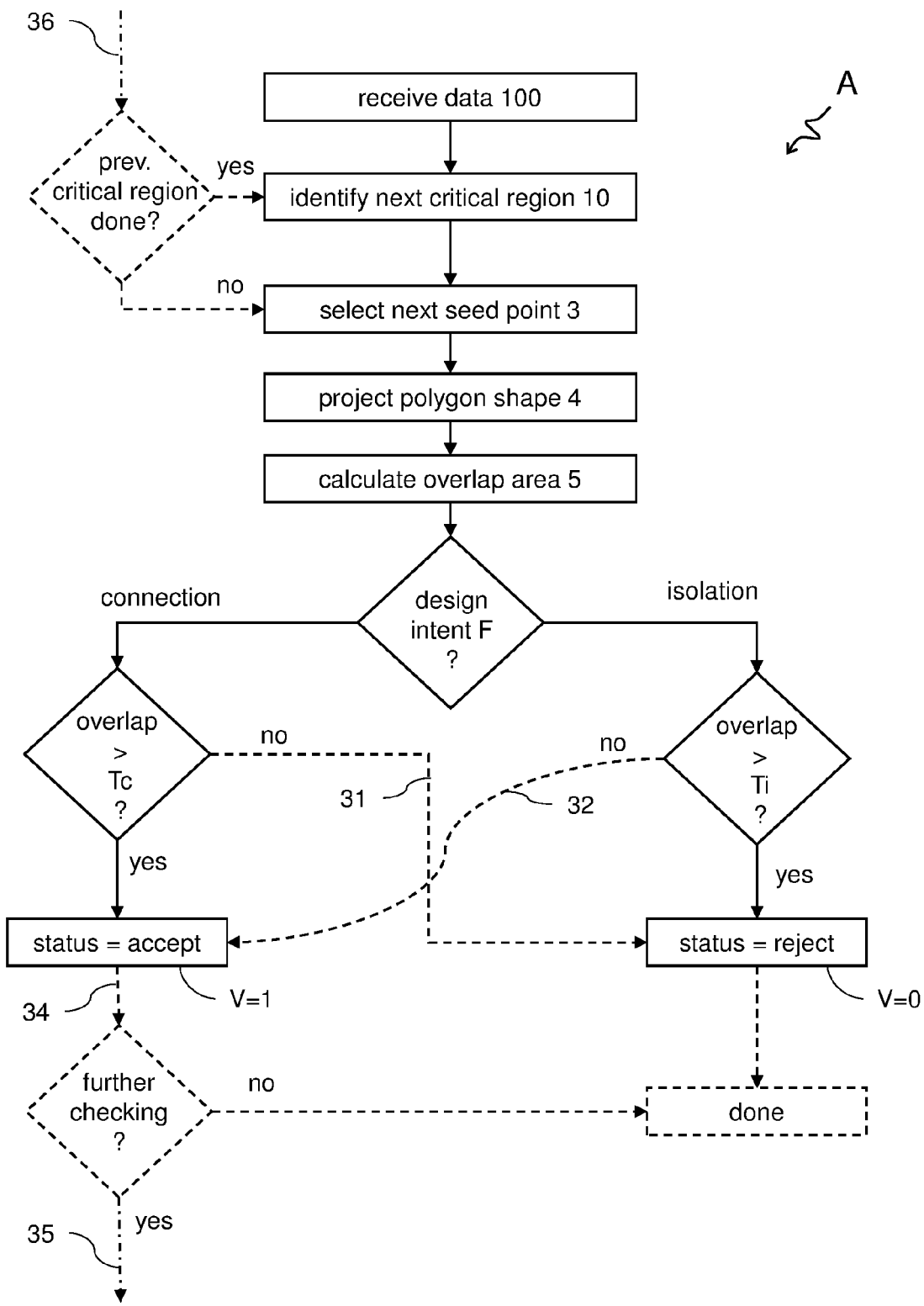
FIG. 3 shows a flow diagram of an area-based method for design rule checking.

FIG. 3 shows a flow diagram of a computer-implemented method A for verification of a layout of an integrated circuit according to a design intent F with a selected manufacturing process. In the following description of the flow diagram, reference will be made to parts of the critical region 10 as was shown e.g. in FIGS. 2A and 2B. The method comprises receiving layout data 100, identifying a critical region 10 of the layout data, selecting a seed point 3 in the critical region, projecting a polygon shape 4 in the critical region proximal to the seed point 3, and calculating an overlap area 5 between the projected polygon shape 4 and a second circuit part 2 in the critical region 10. The layout data may comprises circuit parts in one or more data layers. The data layers may represent physical or derived layers of the integrated circuit.

Depending on a design intent F, the flow diagram splits into a part corresponding to a design wherein an electrical connection was intended and a part wherein an electrical isolation was intended.

If the design intent F is an electrical connection between the first and second circuit parts, the calculated overlap area 5 is checked against a threshold connection area Tc. If the overlap area 5 is larger than the threshold connection area Tc, the layout, or at least this part of the layout, is accepted. The program may e.g. assign a compliance parameter V=1.

If the design intent F is an electrical isolation between the first and second circuit parts, the calculated overlap area 5 is checked against a threshold isolation area Ti, which may be different from the threshold isolation area Ti. If the overlap area 5 is larger than the threshold isolation area Ti, the layout, or at least this part of the layout, is rejected. The program may e.g. assign a compliance parameter V=0.

Some embodiments of the presently disclosed method are indicated with dashed lines in the figure.

As indicated with reference 31, the verification process may optionally reject the layout if the design intent F is an electrical connection and the overlap area 5 is lower than a threshold connection area Tc. This may correspond to a strict compliance wherein all seed points are required to have a sufficient coverage.

As indicated with dashed line 32, the verification process may optionally accept the layout if the design intent F is an electrical isolation and the overlap area 5 is lower than a threshold isolation area Ti. However, it is noted that the process may require further checking to see if also the other seed points are compliant with the selected criterion.

After the layout is accepted, the checking process may continue along arrow 34 to decide if further checking is required. If not, the verification is done and may be considered ready for manufacturing. If further checking is deemed necessary, the checking process may continue along arrow 35.

In one embodiment, the process arrow 35 is continued by arrow 36, wherein it is decided if a verification of the previous critical region has been completed. If not, a next seed point may be selected and the above described process repeated for the same critical region. The verification process may thus comprise repeating for a critical region 10 the steps of selecting seed points on the edge of the first circuit part, projecting polygon shapes proximal to the respective seed points, and calculating overlap areas between the projected polygon shapes and the second circuit part.

If verification of the previous critical region is deemed completed, a next critical region, different from the first critical region may be identified and the process continued from there. In this way the verification process may loop over all critical regions in the data and all seed points in the respective critical regions until a full check is performed.

Besides the presently illustrated checks on individual seed points, the checking may also comprise a cumulative check over multiple seed points as will be further explained with reference to FIG. 4.

While the present figure shows a division between the design intents of an electrical connection or an electrical isolation, alternatively or in addition, also other design intents may be used, e.g. in the manufacturing of a transistor a design intent may be a well-defined overlap between circuit parts in different layers. In general, the verification may comprise rejecting the layout when the overlap area does not conform to a threshold overlap area. The threshold overlap area may be determined by the design intent F. The term "conform" may refer to a condition that the overlap area should be higher than and/or lower than one or more threshold areas. This condition may also be determined by the design intent F. The threshold overlap area may comprise multiple values, e.g. defining a bandwidth of areas that the overlap area should conform to, e.g. a calculated overlap area for a transistor design intent may satisfy a verification condition if it is higher than a minimum threshold area and lower than a maximum threshold area.

Figure 4:
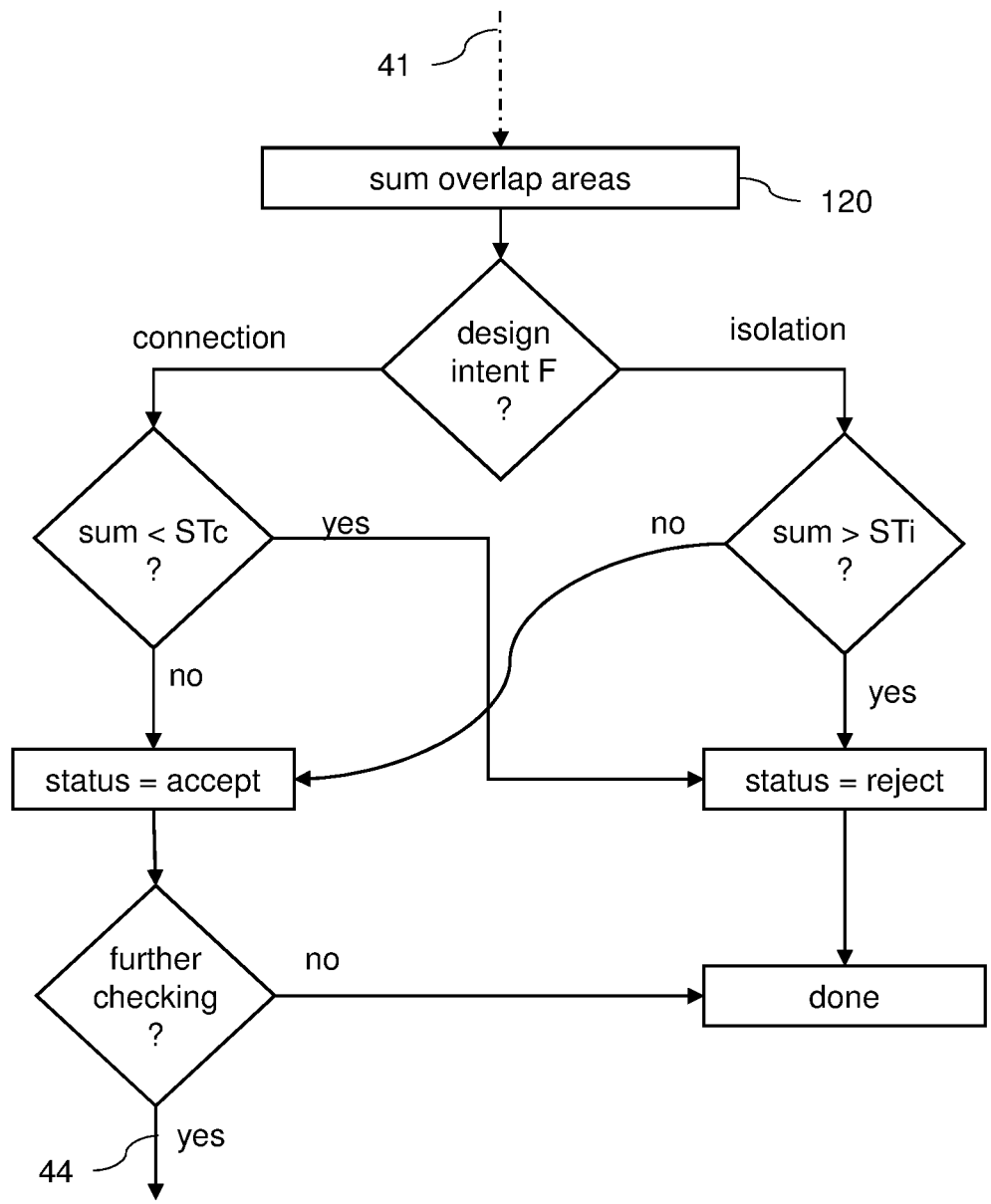
FIG. 4 shows a flow diagram of for design rule checking using summed overlap areas.

FIG. 4 illustrates a flow diagram for design rule checking using summed overlap areas. In particular, arrow 41 may continue the additional checking process of arrow 35 shown in FIG. 3.

The process 120 comprises the steps of selecting an additional seed point on the edge of the first polygon shape, projecting an additional polygon shape proximal to the additional seed point, and calculating an additional overlap area between the additional projected polygon shape and the second circuit part. The additional overlap area may be added to the first overlap area to calculate a sum of the overlap areas. Then, the layout may be further verified in accordance with a design intent F.

In case the design intent F is an electrical connection and the sum of the overlap areas is lower than a threshold connection area sum STc, the layout is rejected. In case the design intent F is an electrical isolation and the sum of the overlap areas is higher than a threshold isolation area sum STi the layout is rejected. After the rejection, the checking process may be finished. Alternatively, the checking process may continue to search for further rejections (not shown in this diagram).

In case the design intent F is an electrical connection and the sum of the overlap areas is not lower than a threshold connection area sum STc, the layout may be accepted. In case the design intent F is an electrical isolation and the sum of the overlap areas is not higher than a threshold isolation area sum STi the layout may be accepted. After the accepting, the checking process may continue further checking, e.g. exiting the flow diagram via arrow 44 and re-entering via arrow 41.

In this way a plurality of overlap areas may be calculated and summed. The sum of the plurality of overlap areas may be checked each round against threshold values. Alternatively, a sum of overlap areas is calculated first and then the sum is checked.

Alternatively or in addition to the flow diagram of FIG. 4, the projected polygon shape 4 may comprise a plurality of separated projections, wherein a calculation of the overlap area 5 naturally comprises a summing of the overlap areas that the separated projections make with the second polygon shape or any further polygon shape.

Figure 5A:
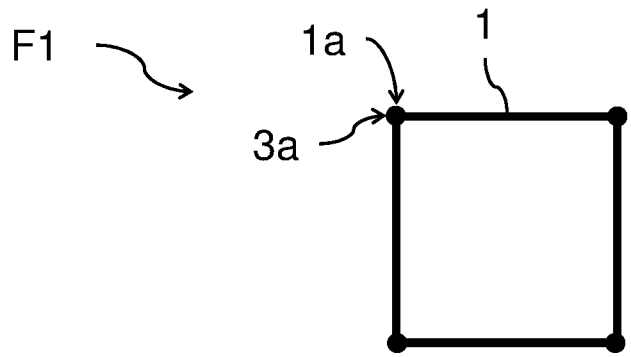
FIGS. 5A-5C illustrate methods for selecting a seed point with respect to one circuit part.
Figure 5B:
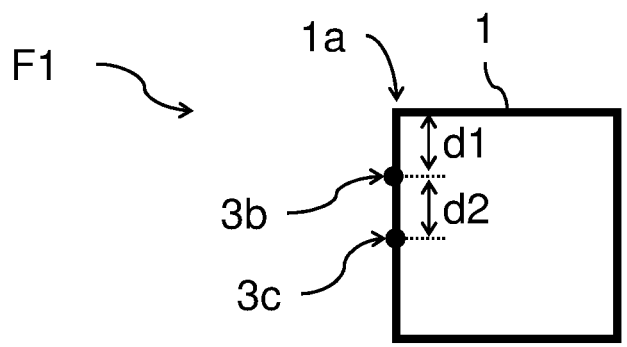
Figure 5C:
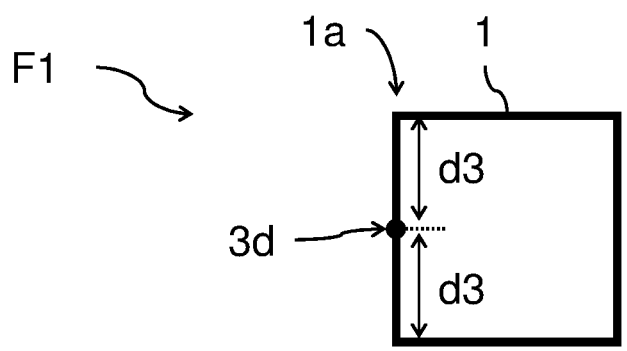

FIGS. 5A-5C illustrate methods F1 for selecting a seed point with respect to the first circuit part 1. As shown, the seed points are selected on the edge 1a of the first circuit part 1.

FIG. 5A illustrates a preferred embodiment wherein the seed point 3 is selected by selecting a point 3a on a corner of the edge 1a of the first circuit part 1. Selecting seed points on the corners of the first circuit part 1 may be especially preferably when said corners point in a direction of the second circuit part 2. The corner point may be a closest point between the circuit parts. Furthermore, it is recognized that especially corner points may be prone to deformation as a result of the manufacturing process.

FIG. 5B illustrates an embodiment wherein the seed point 3 is selected by selecting a point 3b on the edge 1a of the first circuit part 1, the point 3b having a predetermined distance d1 with respect to a corner of the first circuit part 1. This embodiment may have similar advantages as selecting a corner point. It may be particularly suitable for verifying longer line segments wherein the corners are further away.

FIG. 5B further illustrates an embodiment wherein the seed point 3 is selected by selecting a point 3c on the edge 1a of the first circuit part 1, the point 3c having a predetermined distance d2 with respect to another seed point 3b along the edge 1a of the first circuit part 1.

FIG. 5C illustrates an embodiment wherein the seed point 3 is selected by selecting a point 3d on the edge 1a of the first circuit part 1, the point 3d dividing the edge 1a between corners of the edge 1a into two or more line segments of equal length d3.

Figure 6A:
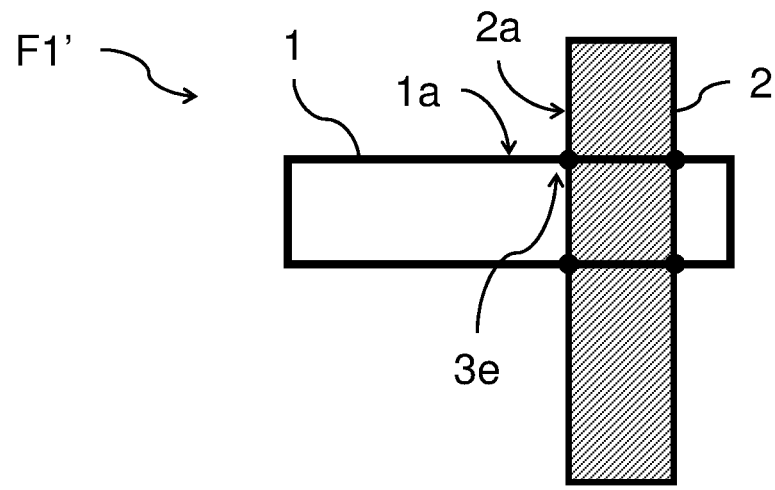
FIGS. 6A and 6B illustrate methods for selecting a seed point with respect to two circuit parts.
Figure 6B:
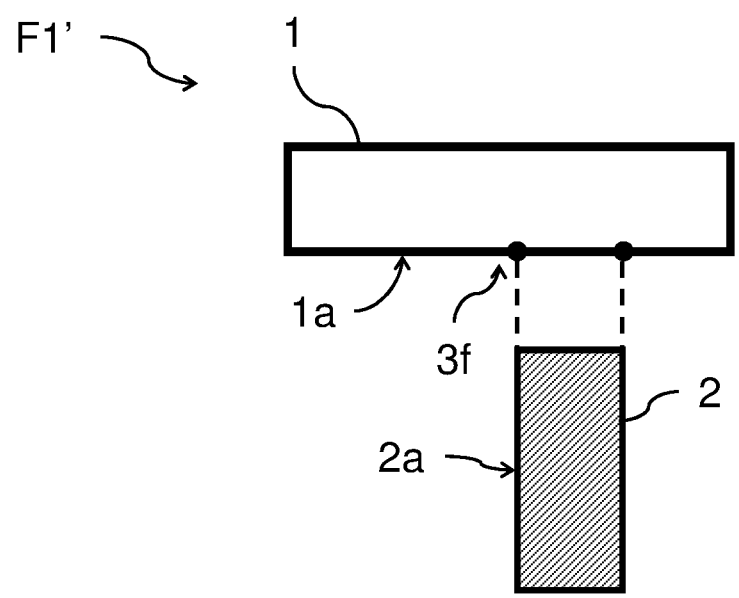

FIGS. 6A and 6B illustrate methods F1' for selecting a seed point with respect to two circuit parts;

FIG. 6A illustrates an embodiment wherein the seed point 3 is selected by selecting a point 3e on a crossing of the edge 1a of the first circuit part with an edge 2a of the second circuit part 2; it will be appreciated that the selection of seed points on a crossing between edges of circuit parts may be equivalent to selecting a corner point of a derived circuit part resulting from a Boolean "AND" operation between the first circuit part 1 and second circuit part 2. In general, the circuit parts representing the integrated circuit may be derived from a Boolean combination (e.g. AND, OR, NOT) between two or more layers of the circuit.

FIG. 6B illustrates an embodiment wherein the seed point 3 is selected by selecting a point 3f on an edge of the first circuit part 1 projected from the second circuit part 2. The projection may e.g. be a projection of a corner of the second circuit part 2 translated in a direction of the second circuit part 2 and/or along an axis of the coordinate system. Alternatively or in addition, the projection may be along a line segment of the second circuit part 2 comprising a corner facing the first circuit part 1. It will be appreciated that the embodiment of FIG. 6B may be equivalent to selecting seed points on the corners of the second circuit part 2 and calculating an overlap area of a corresponding polygon shape with the first circuit part 1.

Generally speaking, a seed point can be a point in the layout that can be generated in a deterministic way (i.e. automatic and repeatable) from a layout using a combination, in any order, of operations which are commonly used in design rule checking, or OPC segmentation definition. Repeatability of the verification process has an advantage that possible issues in the layout can be traced down systematically. The simplest instances of seed points are corners or crossings in the layout. The lines or shapes can originate directly from shapes in the integrated circuit design layout, or they can originate from derived layers. These are layers for which the shapes are calculated by doing standard layer operations as known in DRC tools like Calibre®. These operations include Boolean (and/or/and-not) operations, sizing (under size, over size etc), selection (select shapes that are touching/overlapping/connecting etc), etc, and combinations of these. An additional way to generate seed points (compared to what can commonly be derived from DRC coding practices), is the use of techniques that are present in writing Optical Proximity Correction (OPC) scripts (see e.g. FIG. 9). Edges may be broken into smaller segments based on various mechanisms. Segmentation can be done (but is not limited to), dividing edges in a fixed number of smaller segments, dividing edges in segments of a maximum length, dividing segments by creating breakpoints using projections resulting from other edges, corners or segments, or any combination of these.

Figure 7:
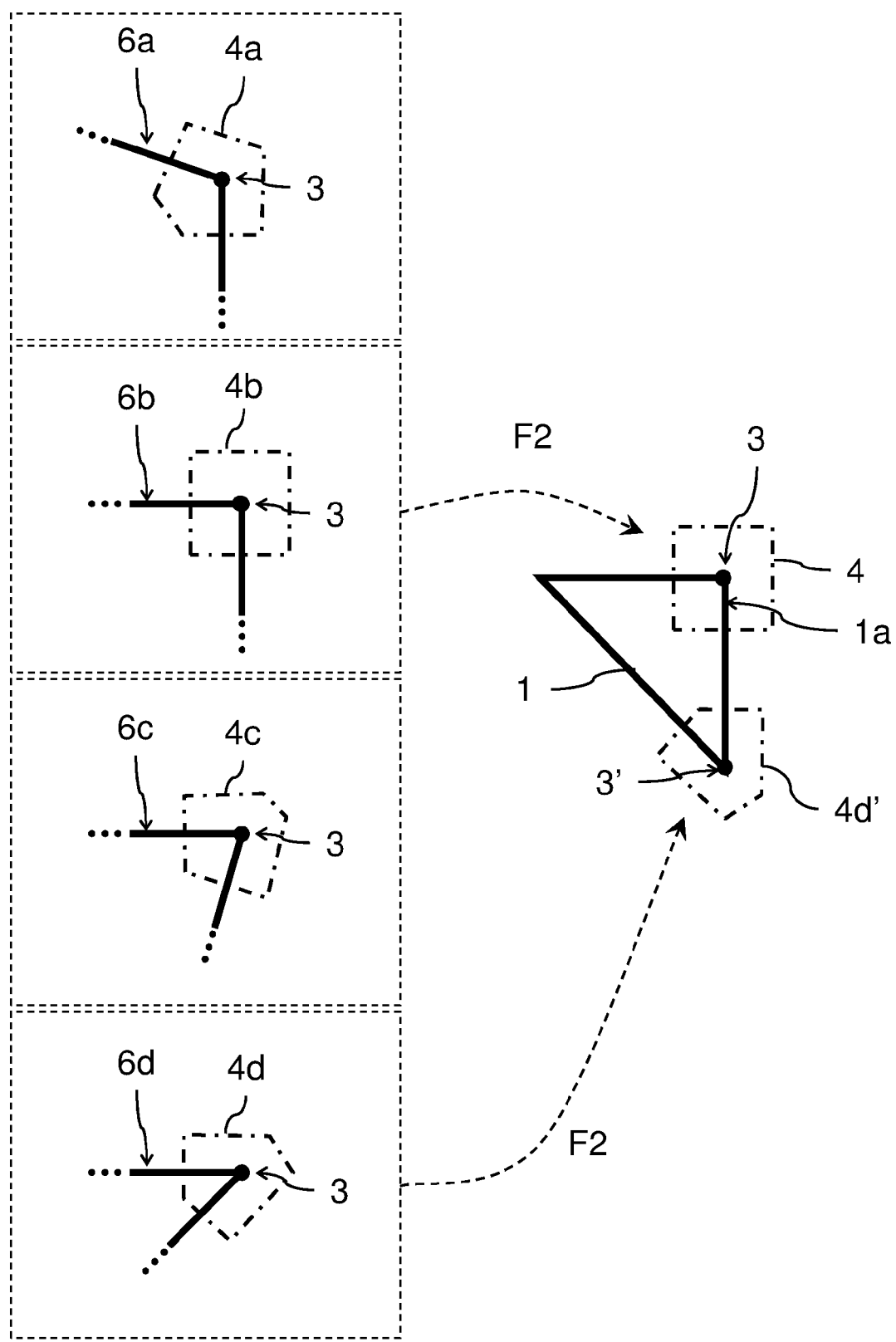
FIG. 7 illustrates a method for selecting a projected polygon shape.

FIG. 7 illustrates a method F2 for selecting a projected polygon shape. The polygon shape 4 is selected from one or more reference shapes 4a, 4b, 4c,4d, wherein a selected reference shape 4b is associated with a local topology 6b of the seed point 3. In the shown embodiment, the projected polygon shape 4 is selected from one or more predefined polygon shapes 4a, 4b, 4c, 4d. Each predefined polygon shape is associated with a respective reference circuit pattern 6a, 6b, 6c, 6d. A predefined polygon shape 4b having a closest matching reference circuit pattern 6b to a local topology of the edge 1a of the first circuit part 1 proximal to the seed point 3 is selected as the projected polygon shape 4.

In this case, e.g. an angle between the line segments around the corner where the seed point 3 was located is used for selecting a best matching reference pattern. Also other ways of pattern recognition may be used for finding a closest matching reference circuit pattern. The reference circuit patterns are shown here as part of a circuit pattern, in particular a corner. Also other parts may be stored as reference patterns. Also a full circuit pattern may be used as a reference pattern. For example, a circuit part such as a transistor that is used many times in a layout may have a set of predefined seed points on an edge thereof and associated polygon shapes to test circuit compliance. The reference pattern may also include a second reference circuit part to be matched against the second circuit part. In one embodiment, a single predefined polygon shape is used; in that case a matching of a reference circuit pattern may not be required. Alternatively or in addition, the reference circuit pattern may comprise a relative position of a reference seed point and predefined polygon shape, wherein the polygon shape is projected as a function of said relative position. The relative position may also comprise an orientation of the corner with respect to position of the predefined polygon shape.

Alternatively to a selection from a discrete number of predefined polygon shapes, the polygon shapes may also be predefined according to a parameterization dependent on the local topology of the edges of the first circuit part 1 around the seed point 3. The predefined polygon shapes may thus be continuously generated from a template. The predefined shapes may also depend on other parameters, e.g. on a design intent of the circuit parts.

The predefined shapes may also be defined by previously defined polygon shapes around previous seed points. These previously defined polygon shapes may act as a template for projection of polygon shapes around new seed points. For example, when a previous polygon shape is defined and projected around a previous seed located at a first corner. A further seed point at a further corner may use the previous polygon shape as a template, e.g. optionally transforming the previous polygon shape to match the local topology of circuit part around the further seed point.

In an embodiment, a respective reference circuit pattern 6d is transformed by resizing, rotation, and/or mirroring to match the local topology of the edge 1a of the first circuit part 1. The projected polygon shape 4d' is a correspondingly transformed predefined polygon shape 4d associated with the closest matching reference circuit pattern 6d. In the example of FIG. 7, when the reference circuit pattern 6d is rotated over an angle of 90 degrees, it matches the local topology of the edge 1a around the seed point 3'. The reference polygon shape 4d is transformed in the same way as the reference pattern, i.e. in this case also rotated by 90 degrees before being projected around the seed point 3'.

In a further embodiment, a seed point 3 is only generated when the local topology of the edge 1a of the first circuit part 1 matches one of the reference circuit patterns 6a, 6b, 6c, 6d within a threshold tolerance. In other words, the generation of seed points may be dependent on the available reference patterns. In this way seed points may be generated for a predefined set of shapes of circuit patterns. At the same time, the polygon shapes that are projected for these predefined shapes may also be determined. This may also be combined with a second reference circuit pattern (not shown), e.g. a seed point is generated based on the presence or absence of a particular shape of the second circuit part 2.

The term "local topology of the seed point" refers to the layout of the edges of the circuit parts around the seed point. The local topology may be formed e.g. by the connecting edges of the first circuit part. In the case of a seed point on a corner, the local topology may thus comprise the edges that form the corner point. Alternatively or in addition, the local topology may comprise other edges of the first circuit part or even the whole first circuit part. Alternatively or in addition, the local topology may comprise edges of the second circuit part.

The selected reference shape may be associated with said local topology e.g. by means of a reference circuit pattern as explained in the embodiment with reference to FIG. 7. Alternatively or in addition, the selected reference shape may be associated with the local topology e.g. by means of a calculation that identifies the position and relative orientation of the corner, e.g. as illustrated with reference to FIG. 8B. Also other associations are possible. In general the selected reference shape may be associated with said local topology in a deterministic (i.e. predictable and repeatable) way. In particular the computer implemented method may comprise a calculation that takes as an input a local topology of the seed point and provides as an output a position and/or shape and/or orientation of the projected polygon shape.

Figure 8A:
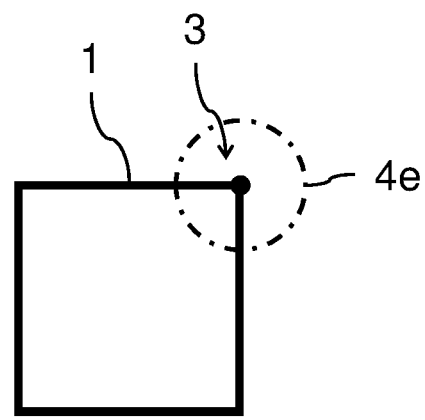
FIGS. 8A and 8B illustrate variations of projected polygon shapes.

FIG. 8A shows a circular polygon shape 4e. While it may be computationally preferred that the polygon shape consists of straight line segments, a circular polygon shape may have an advantage of more accurately sampling a specific distance around the seed point 3.

Figure 8B:
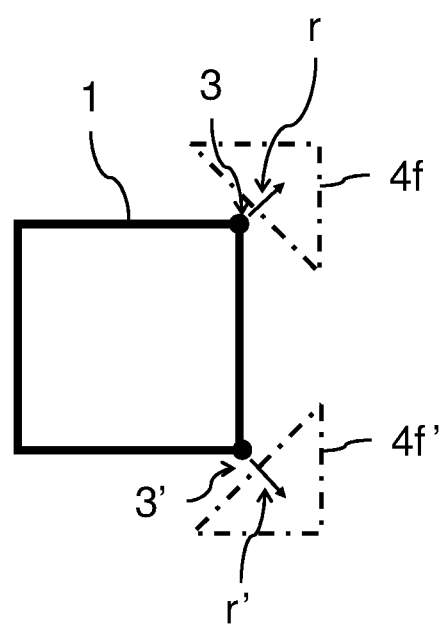

FIG. 8B shows triangular polygon shapes 4f and 4f that are projected separate from the respective seed points 3 and 3'. Although it may be preferred that a perimeter of the polygon shape encloses the respective seed point to sample an area on all sides of the seed point, the presently shown configuration may provide similar results for circumstances wherein a second polygon shape is expected to be on a corner of the first circuit part 1.

It is further illustrated how the polygon shape 4f may be used as a template for the polygon shape 4f', e.g. after transformation, in this case rotation or mirroring. The transformation may occur in accordance with a direction "r" of the seed point 3 relative to a local topology of the first circuit part 1. As shown this direction is rotated in the other seed point 3', indicated with r'.

Figure 9:
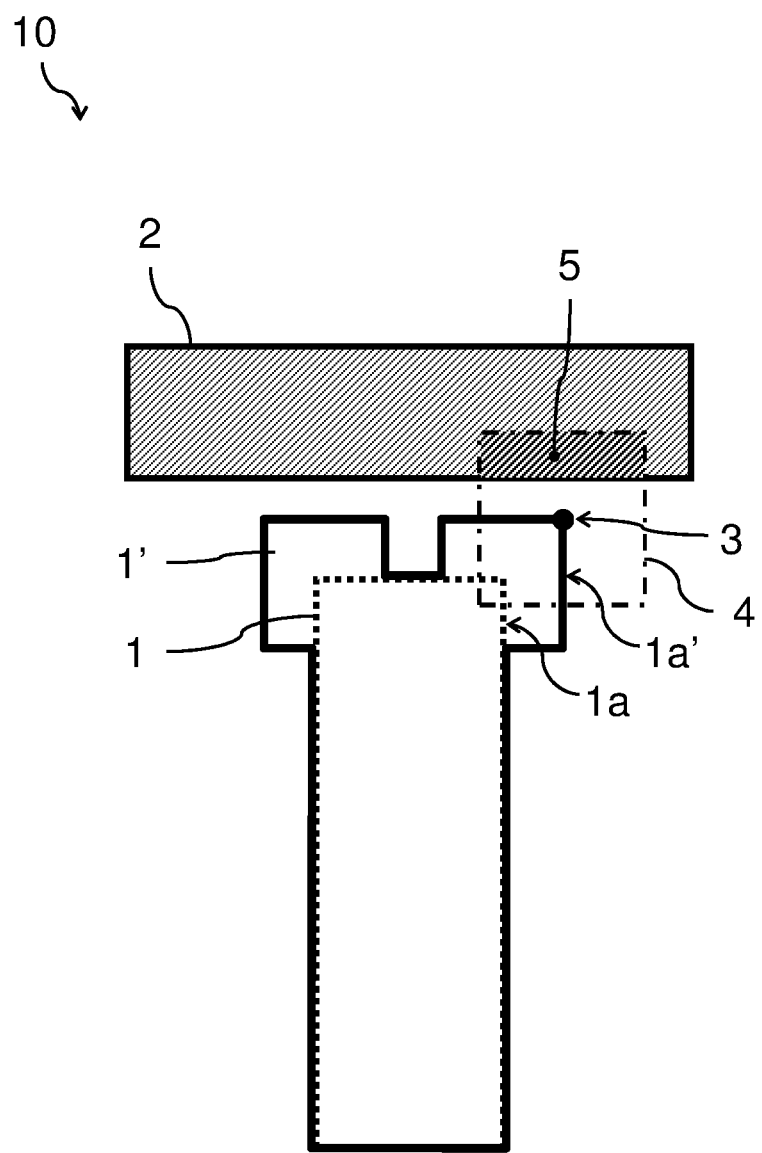
FIG. 9 illustrates a circuit part is reshaped by optical proximity correction.

FIG. 9 illustrates a critical region 10 wherein a first circuit part 1 is reshaped by optical proximity correction (OPC) prior to applying the verification method as discussed above. In particular, it is shown that the seed point 3 is selected on a shifted edge 1a' of the reshaped first circuit part 1'.

When narrow lines are drawn in a circuit, the line ends may have a tendency to become shorter during manufacturing, as compared to what the intent was during the design. This may be e.g. due to rounding of material as an effect of a lithographic process. This difference between the design intended layout and the actual result on silicon may be compensated for by the said OPC process. In that process the designed shapes are modified to compensate the lithographic effects during processing, and to have the final result as close as possible to the intent. In this figure this is done by adding so called hammerheads or serifs to the line end.

To do OPC, it is preferred that there is sufficient space in the layout to allow extension of the original drawing by the serifs or hammerhead (or other shapes). If such space is not there, it may result in short circuits between the printed materials, or in problems in fabricating the lithographic masks.

Also this desire may be formulated as a design rule, and in the traditional manner that may be done by posing a complicated set of restrictions on various distances between the shapes. However, in using the presently disclosed methods, this may be simplified by calculating an overlap area 5 between the second circuit part 2 and the polygon shape 4 projected proximal to the seed point 3 on the shifted edge 1a' of the OPC reshaped first circuit part 1'.

Besides the presently shown OPC, also other types of reshaping of the first circuit part 1 may occur prior to the projection of the seed points. In one embodiment, the first circuit part may be enlarged prior to the application of seed points.

Figure 10:
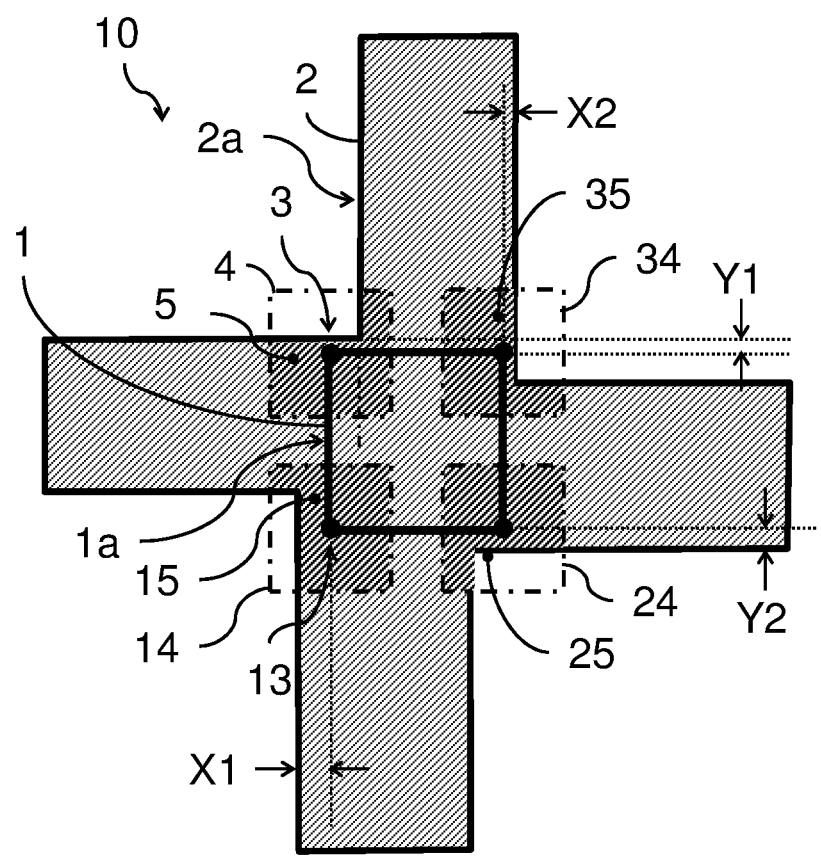
FIG. 10 illustrates an example of layout verification.

FIG. 10 illustrates an example of layout verification. In this example, a multi-layer circuit comprises a critical region 10 comprising a first circuit part 1 (shaped as a square) in a first layer of the circuit and a second circuit part 2 (shaped as a cross) in a second layer of the circuit. A design intent in this case is to have an electrical connection between the first circuit part 1 and the second circuit part 2. To achieve this, it is desired that the first circuit part 1 falls within the borders of the second circuit part 2.

In a traditional distance checking method, this may lead to complicated design rules, e.g. restricting all distances X1, X2, Y1, Y2 to be within a certain threshold. In fact because the distances in this case are so small, there may not be a satisfactory position according to a distance checking method. Furthermore it may not be a priori clear which distances should be checked, e.g. the edge 2a of the second circuit part 2 is beyond the edge 1a of the first circuit part 1.

On the other hand, using the presently disclosed design rules involving the calculation of overlap areas may be simpler and more in line with physical manufacturing conditions. An example design rule in this case may be to calculate the overlap areas 5, 15, 25, 35 of the respective polygon shapes 4, 14, 24, 34 with the second circuit part 2. The layout may be accepted if each of the overlap areas is higher than a threshold connection area, e.g. 70% of the area of the respective polygon shapes. Alternatively or in addition the layout may be rejected if a sum of the overlap areas is lower than a threshold connection area sum STc.

The verification process may also be applied iteratively, to find an acceptable layout. In the said iterations, an optimization routine of a design program may be programmed to automatically search for a maximum, minimum or threshold overlap area and/or sum of overlap areas. For example, in the present case of FIG. 10, a program may automatically try to maximize a sum of the overlap areas 5, 15, 25, 35 to establish a satisfactory electrical connection between the first circuit part 1 and the second circuit part 2. In addition, the program may also require that each of the individual overlap areas be larger than a minimum threshold.

Figure 11:
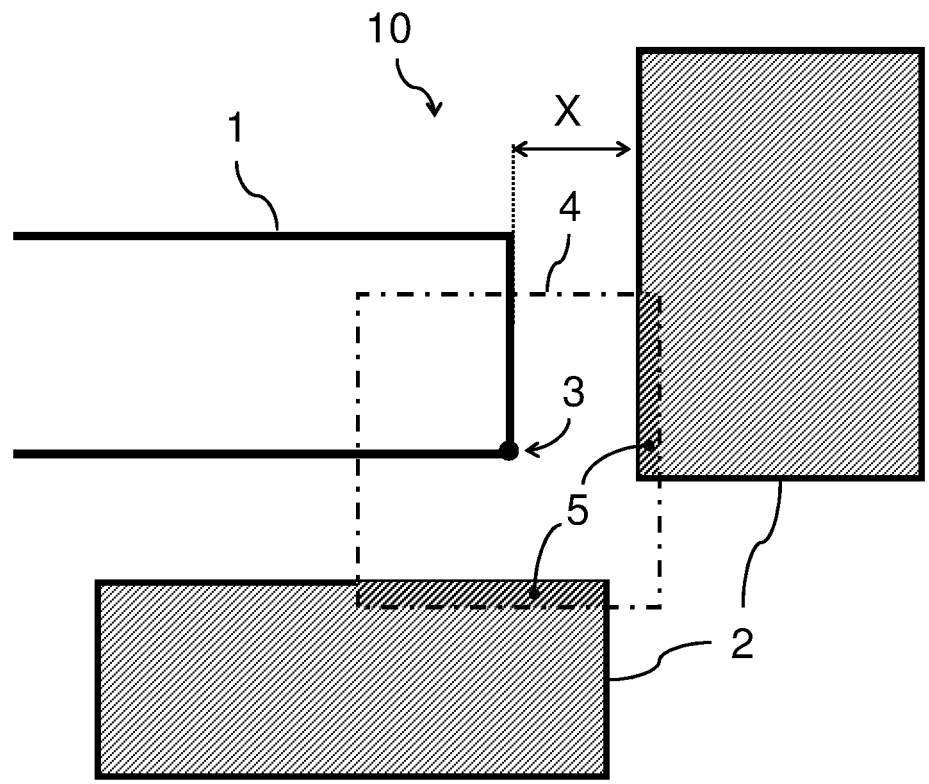
FIG. 11 illustrates another example of layout verification.

FIG. 11 illustrates another example of layout verification. In this example, a circuit (mono or multi-layer) comprises a critical region 10. The critical region may be triggered e.g. by a proximity X of between the first circuit part 1 and the second circuit part 2. The critical region 10 comprises the first circuit part 1 (e.g. a line ending) and one or more second circuit parts 2. A design intent in this case is to have an electrical isolation between the first circuit part 1 and the second circuit parts 2, i.e. in this case all surrounding circuit parts. But since a line end is involved, it is preferred to have sufficient space at the line-end for OPC to position hammerheads or similar structures. To achieve this, it is desired that the second circuit parts 2 are sufficiently distanced from the first circuit part 1, or that there is sufficient free area to create the OPC structure in either horizontal (to the right of seed point 3) or vertical (below seed point 3), of sufficient size, e.g. sufficient area.

Using the presently disclosed methods, a seed point 3 is chosen on a corner of the first circuit part 1. A polygon shape 4 is projected proximal to the seed point 3. The layout may be rejected if the (total) overlap area 5 is higher than a threshold isolation area, e.g. 5% of the area of the polygon shape 4.

Figure 12:
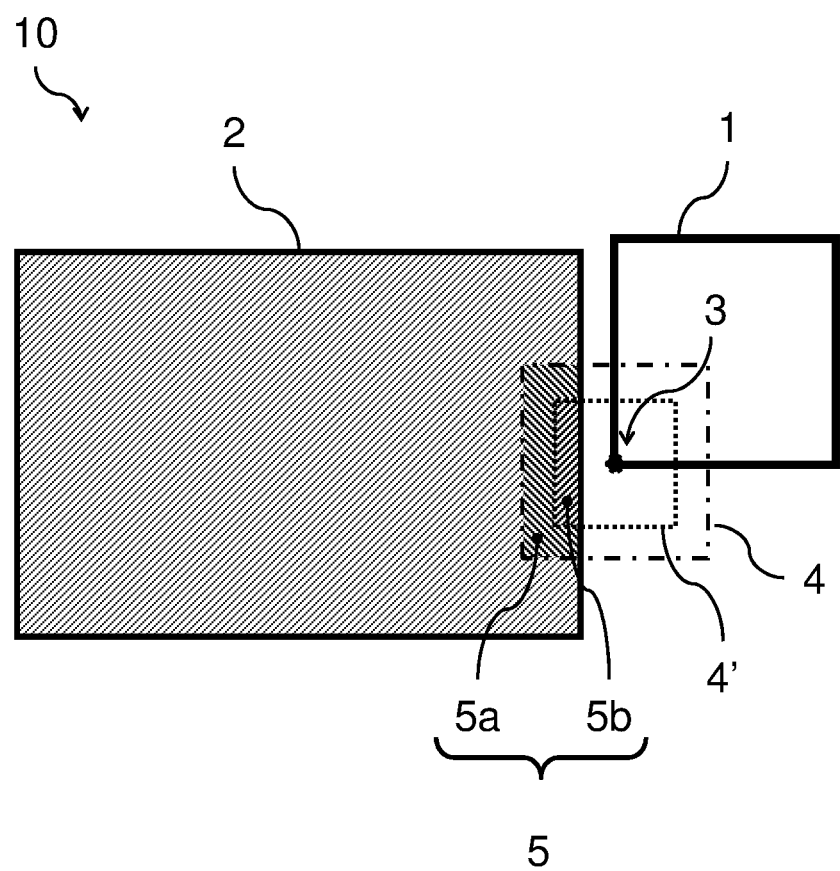
FIG. 12 illustrates an embodiment wherein the overlap area is multiplied by a weighting factor.

FIG. 12 illustrates an embodiment wherein the overlap area 5 is multiplied by a weighting factor that is variably dependent on a position relative to the polygon shape 4. For example, the polygon shape 4 may be divided into sub regions, e.g. by a smaller polygon shape 4'. The overlap area 5a of the outer region may be weighted differently than the overlap area 5b of the inner region. For example, the overlap area 5a may have a weighting factor Wa=0.5 while the overlap area 5a has a weighting factor Wb=1.0. The total area is calculated by multiplying the overlap areas 5a and 5b by their respective weighting factors Wa and Wb. This weighted area may then be checked against a threshold area. The verification method according to this embodiment may e.g. take into account a statistical chance that some areas although further distanced, may still influence a compliance of the circuit when they are sufficiently covered.

Alternatively to the shown discrete weighting of different sub regions of the polygon shape 4, the weighting may also be according to a continuous weighting factor, e.g. a weighting factor W(x,y) that varies according to a position relative to the polygon shape 4. However, it will be appreciated that a discrete weighting factor may be computationally more beneficial.

Figure 13:
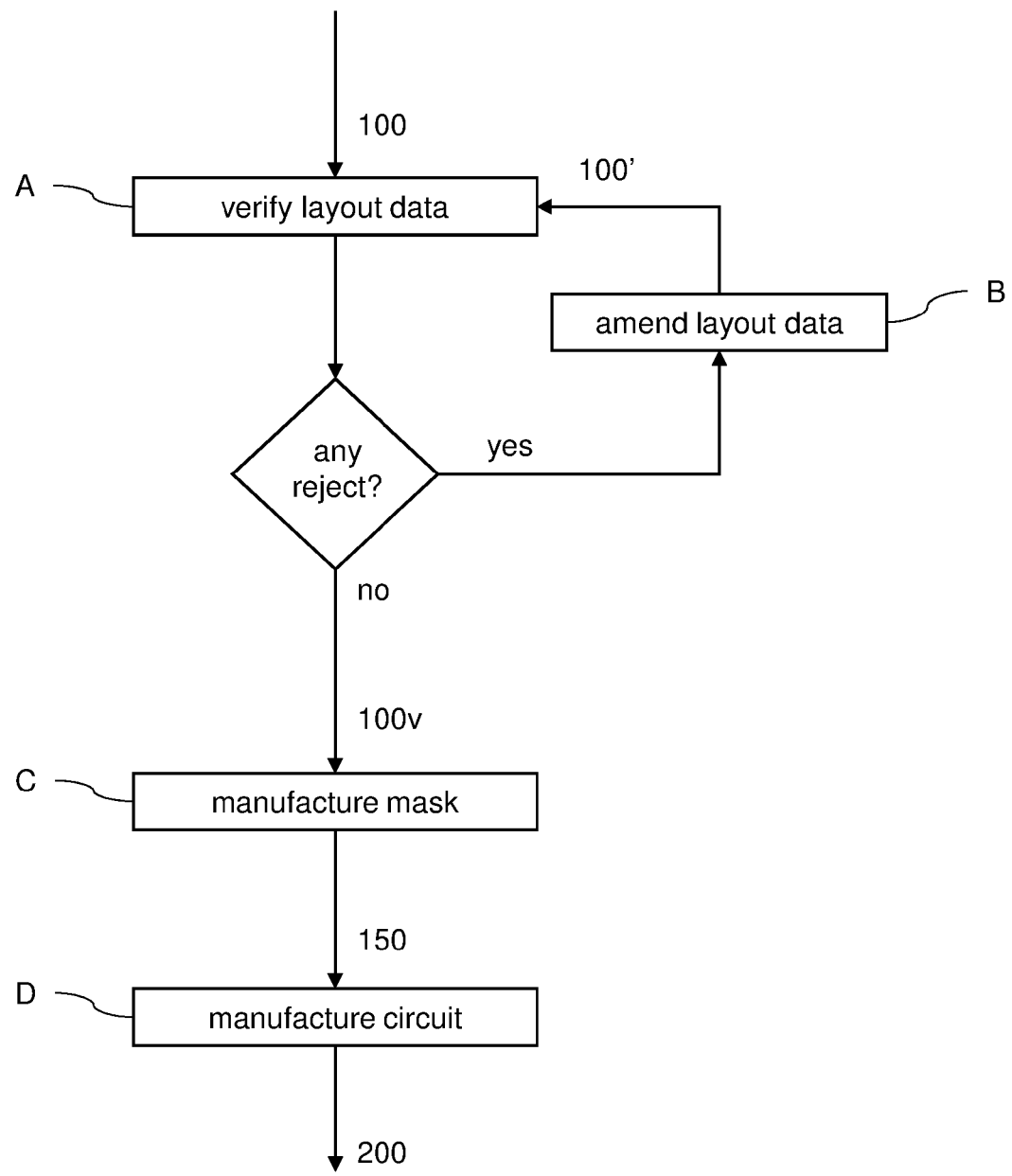
FIG. 13 illustrates various steps in a method for manufacturing an integrated circuit.

FIG. 13 illustrates various steps in a method for manufacturing an integrated circuit 200. An advantageous method "A" for verifying layout data 100 was described above, e.g. with reference to FIG. 3.

As shown, the verification process "A" tests a provided layout data 100 representing the integrated circuit 200. When the verification process "A" yields any rejections, the layout data may be amended by amending process "B", e.g. an automatic optimization routine or a manual correction. The verification process "A" and amending process "B" may be repeated until the layout data is fully accepted.

The verification process "A" and/or the amending process "B" as describe above may be performed by computer system for verification of a layout of an integrated circuit with a selected manufacturing process. The computer system may comprise a memory and one or more processors coupled to the memory. The memory may contain a set of instructions which, when executed by the one or more processors, cause the one or more processors to perform operations comprising the method as described above, e.g. the verification process "A" and/or the amending process "B". The processes A and B may also be encoded as a computer program on a non-transitory computer storage medium. E.g. the computer program may comprise a set of instructions which, when executed by one or more computers, cause the one or more computers to perform operations comprising the method as described.

The verified layout data 100v is then used for manufacturing a mask 150 according to mask manufacturing process C. Said manufacturing may comprise e.g. etching the pattern of the verified layout data 100v into the mask or any other known method for manufacturing the mask from layout data.

Finally, the integrated circuit 200 may be manufactured using the mask 150 according to a circuit manufacturing process D. In a lithographic manufacturing process, e.g. an image of the mask may be projected onto a photo-sensitive layer on a substrate. The said layer may be developed and converted into a circuit pattern, e.g. comprising metal or semi-conductor material. The mask may also comprise a variable light transmission or reflection means, e.g. a liquid crystal display (LCD) or digital micro-mirror device (DMD) that can variably transmit light to a substrate or mask in accordance with the layout data or a layer thereof. Alternative to a lithographic manufacturing process also other processes may be used for producing a circuit from a mask, e.g. by stamping the mask into a mouldable material. Also, a circuit may be produced from the layout data without using a mask, e.g. a direct manufacturing method such as laser writing.

Figure 14A:
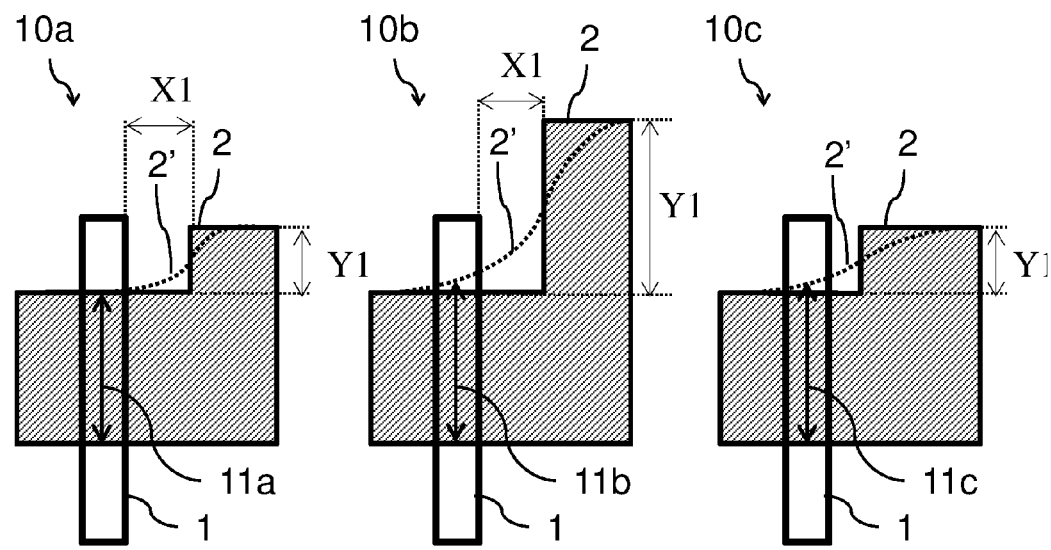
FIGS. 14A and 14B illustrate another example of layout verification.
Figure 14B:
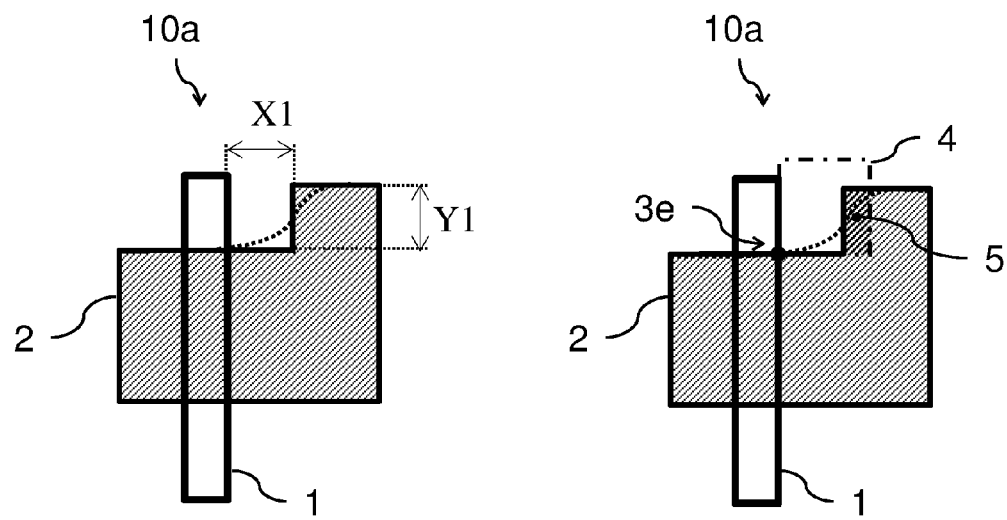

FIGS. 14A and 14B illustrates an example of corner rounding during diffusion printing wherein the present methods can also be advantageously used to check for compliance of the layout with a design intent. In this case the design intent is to provide a transistor wherein the overlap between the first circuit part 1 and the second circuit part 2, is controlled to be within specific limits to provide a desired conduction characteristic that is neither too small nor too big.

FIG. 14A shows three different examples of critical areas 10a, 10b, and 10c. The dotted lines 2' indicate possible shapes of the second circuit parts 2 after a manufacturing process. It is illustrated that the manufacturing process may lead to a reshaping of the designed parts, in this case by the diffusion printing. It will be noted that the diffusion edge 2' depends on the layout of the second circuit part, e.g. being a function of the distances X1 and Y1. It will further be noted, as indicated by the different lengths if the arrows 11a, 11b, and 11c, that the said diffusion may cause different overlap between the first circuit part 1 and the second circuit part 2. Such variation in overlap may be undesired for certain designs, e.g. of a transistor, wherein the amount of current is to be controlled.

FIG. 14B illustrates on the left side a traditional method of verification involving distance checks of the distances X1 and Y1. It will be appreciated that the precise dependence of the overlap area between the first and second circuit parts (indicated by the arrows 11a, 11b, and 11c in FIG. 14A) may depend in a rather complicated way on these distances.

On the other hand, as illustrated on the right hand side of FIG. 14B, the present method can provide a more simple approximation of the amount of expected diffusion by sampling the overlap area 5 of the second circuit part with a polygon shape 4 projected proximal to the seed point 3e. In this case, the seed point 3e is chosen on an intersection between the first and second circuit parts. It is thus illustrated that the present methods are suitable for various different design intents, in this case the proper width of a transistor, which defines the current amplification factor, but is distorted by the exact layout of the shapes in close proximity to the actual transistor.

In the present example, the verification can pass if the overlap area 5 is lower than a predetermined maximum threshold. In another example (not shown), depending on the shape of the adjacent structures, it can be desired that the overlap area 5 is higher than a predetermined minimum threshold. Accordingly, in one embodiment, the method for verification comprises rejecting the layout if the design intent is to have a controlled overlap between the first and second circuit parts and the overlap area between the projected polygon shape and the second circuit part is higher than a threshold maximum area or the overlap area is lower than a threshold minimum area.

Of course also other design intents can be envisaged, e.g. an intent to have a specific overlap within a certain band width, having a minimum overlap while being sufficiently separated from adjacent structures, having a maximum overlap while being within a threshold distance, designs wherein three or more circuit parts play a role, combinations thereof, et cetera. Accordingly, the applicability of the present methods is not limited to the design intents as illustrated by the present examples.

The various elements of the embodiments as discussed and shown offer certain advantages, such as providing a simple to implement set of design rules that take into account physical manufacturing conditions. Of course, it is to be appreciated that any one of the above embodiments or processes may be combined with one or more other embodiments or processes to provide even further improvements in finding and matching designs and advantages. It is appreciated that this invention offers particular advantages to checking layouts of integrated circuits, and in general can be applied for any application wherein a design is verified with certain manufacturing conditions.

The present disclosure may provide a method of checking an integrated circuit layout for compliance with manufacturing requirements by: receiving a integrated circuit layout, defining seed points in the layout by selecting corners, crossings, segments ends in the layout, defining regions of interest as being reference regions of interest that are transformed according to the transformation of the seed point, calculating the area of some layer, the same or different than the layer that generates the seed points, that intersects the regions of interest, taking the area separately for each individual region of interest, and for each region of interest check if the calculated area is compliant with some predefined limits. The seed points may be corners of shapes or intersections of edges or end-points of edge segments. The seed points may be generated after Boolean layer operations (e.g. deciding on the generation of a seed point based on the presence or absence of circuit parts in adjacent layers) or sizing layer operations (e.g. enlarging the circuit parts) are applied to layout, or where these operations are applied to select a subset of the seed points, or a combination of these in any order. The calculation of some layer in the region of a seed point may be subject to selection, either inclusion or exclusion, of those shapes that trigger the existence of the seed point. The area calculation may have a weighting factor applied to it based on the position in the region of interest. The check may be a combination of traditional distance checks and checks according to the presently disclosed methods, e.g. using some Boolean expression. For some or all regions of interest (i.e. the projected polygon shapes) an area of circuit parts in one or multiple layers that overlap this region of interest may be calculated. This calculation can be subject to some selection of shapes in the layer being checked, based on the origin of the seed point of the region of interest. If the calculated area is acceptable (or not) according to some measure, regions that do (or do not) comply with this check may be marked in the layout.

Finally, the above-discussion is intended to be merely illustrative of the present system and should not be construed as limiting the appended claims to any particular embodiment or group of embodiments. Thus, while the present method has been described in particular detail with reference to specific exemplary embodiments thereof, it should also be appreciated that numerous modifications and alternative embodiments may be devised by those having ordinary skill in the art without departing from the scope of the present disclosure. The specification and drawings are accordingly to be regarded in an illustrative manner and are not intended to limit the scope of the appended claims.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage.

The invention claimed is:

1. A computer-implemented method for verification of a layout of an integrated circuit according to a design intent with a selected manufacturing process, the method comprising:
   receiving layout data comprising circuit parts in one or more layers representing the integrated circuit;
   defining corner points of a first circuit part as seed points;
   for each seed point;
      projecting a polygon shape proximal to the seed point wherein the polygon shape is selected from one or more reference shapes that are distinct from the circuit parts, wherein a selected reference shape is associated with a local topology around the seed point;
      calculating an overlap area between the projected polygon shape and a second circuit part in the critical region; and
      rejecting the layout if the design intent is an electrical connection between the first and second circuit parts and the overlap area is lower than a threshold connection area;
      rejecting the layout if the design intent is an electrical isolation between the first and second circuit parts and the overlap area is higher than a threshold isolation area
      generating a verification result indicating rejection of the layout data; and
      amending the layout based on the rejection.

2. The method according to claim 1, comprising:
   calculating, for a plurality of seed points and associated projected polygon shapes, a plurality of overlap areas between the said projected polygon shapes and the second circuit part summing the overlap areas; and
   further comprising at least one of the following steps:

rejecting the layout if the design intent is an electrical connection and the sum of the overlap areas is lower than a threshold connection area sum; and rejecting the layout if the design intent is an electrical isolation and the sum of the overlap areas is higher than a threshold isolation area sum.

3. The method according to claim 1, wherein the polygon shape has a surface area lower than a surface area of the first circuit part and higher than a surface area of a minimum spot size of the selected manufacturing process.

4. The method according to claim 1, wherein the first circuit part is selected in a critical region that is identified as a region comprising the first circuit part and the second circuit part, wherein a distance between an edge of the first circuit part and an edge of the second circuit part is within a threshold distance.

5. The method according to claim 1 wherein a seed point is further selected by one of:
   selecting a point on an edge of the first circuit part, the point having a predetermined distance with respect to a corner of the first circuit part;
   selecting a point on an edge of the first circuit part, the point having a predetermined distance with respect to another seed point along the edge of the first circuit part;
   selecting a point on an edge of the first circuit part, the point dividing the edge between corners of the edge into two or more line segments of equal length;
   selecting a point on a crossing of an edge of the first circuit part with an edge of the second circuit part; and
   selecting a point on an edge of the first circuit part projected from the second circuit part.

6. The method according to claim 1, wherein the one or more reference shapes are associated with respective reference circuit patterns, and wherein the selected reference shape is associated with the local topology by transforming a respective reference circuit pattern to match the local topology.

7. The method according to claim 6, wherein a seed point is only generated when the local topology of the seed point matches one of the reference circuit patterns within a threshold tolerance.

8. The method according to claim 1 wherein the first circuit part is reshaped by optical proximity correction prior to the verification, and wherein the seed point is selected on a shifted edge of the reshaped first circuit part.

9. The method according to claim 1 wherein the overlap area is multiplied by a weighting factor that is variably dependent on a position relative to the polygon shape.

10. The method of claim 1 further comprising:
    providing layout data representing an integrated circuit; and
    repeating the steps of;
       testing verification of the layout data; and
       amending the layout data until the layout data is fully accepted, thereby providing verified layout data.

11. The method according to claim 10 further comprising manufacturing a mask using the verified layout data.

12. The method according to claim 11 further comprising manufacturing the integrated circuit using the mask.

13. A computer system for verification of a layout of an integrated circuit with a selected manufacturing process, the computer system comprising:
    a memory; and
    one or more processors coupled to the memory wherein the memory contains a set of instructions which, when executed by the one or more processors, cause the one or more processors to perform operations comprising:
    receiving layout data comprising circuit parts in one or more layers representing the integrated circuit;
    defining corner points of a first circuit part as seed points;
    for each seed point;
       projecting a polygon shape proximal to the seed point wherein the polygon shape is selected from one or more reference shapes that are distinct from the circuit parts, wherein a selected reference shape is associated with a local topology around the seed point;
       calculating an overlap area between the projected polygon shape and a second circuit part in the critical region; and
       rejecting the layout if the design intent is an electrical connection between the first and second circuit parts and the overlap area is lower than a threshold connection area;
       rejecting the layout if the design intent is an electrical isolation between the first and second circuit parts and the overlap area is higher than a threshold isolation area
       generating a verification result indicating rejection of the layout data; and
       amending the layout based on the rejection.

14. The computer system of claim 13, wherein the set of instructions further cause the one or more processors to perform operations comprising:
    calculating, for a plurality of seed points and associated projected polygon shapes, a plurality of overlap areas between the said projected polygon shapes and the second circuit part summing the overlap areas; and
    further comprising at least one of the following steps:
       rejecting the layout if the design intent is an electrical connection and the sum of the overlap areas is lower than a threshold connection area sum; and
       rejecting the layout if the design intent is an electrical isolation and the sum of the overlap areas is higher than a threshold isolation area sum.

15. The computer system of claim 13, wherein the set of instructions further cause the one or more processors to perform operations comprising projecting a polygon shape, wherein the polygon shape has a surface area lower than a surface area of the first circuit part and higher than a surface area of a minimum spot size of the selected manufacturing process.

16. The computer system of claim 13, wherein the set of instructions further cause the one or more processors to perform operations comprising a selection of a critical region that is identified as a region comprising the first circuit part and the second circuit part, wherein a distance between an edge of the first circuit part and an edge of the second circuit part is within a threshold distance and wherein the first circuit part is selected in a critical region.

17. A non-transitory computer storage medium encoded with a computer program, the computer program comprising a set of instructions which, when executed by one or more computers cause the one or more computers to perform operations comprising:
    receiving layout data comprising circuit parts in one or more layers representing the integrated circuit;
    defining corner points of a first circuit part as seed points;
    for each seed point
       projecting a polygon shape proximal to the seed point wherein the polygon shape is selected from one or more reference shapes that are distinct from the circuit parts, wherein a selected reference shape is associated with a local topology around the seed point;
calculating an overlap area between the projected polygon shape and a second circuit part in the critical region; and
rejecting the layout if the design intent is an electrical connection between the first and second circuit parts and the overlap area is lower than a threshold connection area;
rejecting the layout if the design intent is an electrical isolation between the first and second circuit parts and the overlap area is higher than a threshold isolation area
generating a verification result indicating rejection of the layout data; and
amending the layout based on the rejection.

* * * * *